United States Patent [19]
Choi

[11] Patent Number: 6,113,700
[45] Date of Patent: Sep. 5, 2000

[54] GAS DIFFUSER HAVING VARYING THICKNESS AND NOZZLE DENSITY FOR SEMICONDUCTOR DEVICE FABRICATION AND REACTION FURNACE WITH GAS DIFFUSER

[75] Inventor: Jun-young Choi, Inchun, Rep. of Korea

[73] Assignee: Samsung Electronics Co., Ltd., Suwon, Rep. of Korea

[21] Appl. No.: 09/210,592

[22] Filed: Dec. 15, 1998

[30] Foreign Application Priority Data

Dec. 30, 1997 [KR] Rep. of Korea ................. 97-79196

[51] Int. Cl.[7] ................................................. C23C 16/00
[52] U.S. Cl. .............................................. 118/715; 156/345
[58] Field of Search ............................. 118/715; 156/345; 204/298.07

[56] References Cited

U.S. PATENT DOCUMENTS 5,221,556  6/1993  Hawkins et al. ........................ 118/715
5,439,524  8/1995  Cain et al. ............................... 118/715
5,990,016  11/1999  Kim et al. ................................ 156/345

*Primary Examiner*—Shrive Beck
*Assistant Examiner*—Sylvia R. MacArthur
*Attorney, Agent, or Firm*—Jones Volentine, LLP

[57] ABSTRACT

A gas diffuser for semiconductor device fabrication has the form of a hermetic cylinder with a hollow formed therein and is provided with a gas inlet opened upward for the gas to flow into the hollow, and a disk-shaped diffusion plate disposed in the lower side thereof with a plurality of nozzles to direct and control the stream of the gas pouring out of the hollow. The thickness of the diffusion plate increases with radial distance from the center thereof, such that lengths of the nozzles through which the gas passes also increase with radial distance from the center of the diffusion plate. A reaction furnace has the gas diffuser disposed in an upper portion thereof, and a support plate for supporting the wafer disposed in a lower portion thereof. The distance from the surface of the wafer to the diffusion plate of the gas diffuser is half the radius of the wafer.

52 Claims, 16 Drawing Sheets

GAS DIFFUSER HAVING VARYING THICKNESS AND NOZZLE DENSITY FOR SEMICONDUCTOR DEVICE FABRICATION AND REACTION FURNACE WITH GAS DIFFUSER

BACKGROUND OF THE INVENTION

1. Field of the Invention

The present invention generally relates to a gas diffuser for semiconductor device fabrication and a reaction furnace provided with the gas diffuser. More particularly, the present invention relates to a gas diffuser for semiconductor device fabrication in which the thickness of the gas diffuser and the density of nozzles penetrating the gas diffuser are designed to deposit uniform layers on a target object, and to a reaction furnace using the gas diffuser.

2. Description of the Related Art

In general, as shown in FIG. 1, a reaction furnace for fabricating semiconductor devices, such as CVD equipment or a dry etcher, has a gas diffuser 12 disposed in the upper portion of a space which has an exhaust hole 10 formed to discharge a gas downwards, and a support plate 14 for supporting a wafer 1 held in the lower portion of the space.

Such a conventional gas diffuser 12 has the form of a hermetic cylinder with a hollow formed inside. The gas diffuser 12 is provided with a gas inlet 16 opened upward for gas to enter the hollow, and a disk-shaped diffusion plate 18 disposed below the hollow and having a plurality of nozzles 20 to guide and control the stream of gas pouring out of the hollow. The nozzles 20 are arranged in a uniform density throughout diffusion plate 18.

With that construction, gas or liquid descends from the gas diffuser 12 to the inside of the reaction furnace so that an even film is deposited on the surface of a target object or a uniform etching is carried out in the course of a process for fabricating semiconductor devices.

Actually, it is very difficult to obtain films with a desired uniformity and many efforts have been made to optimize the form of the gas diffuser and the reaction furnace, including rotation of the wafer support plate 14. Such rotation may cause an increase in the uniformity of deposited films in the circumferential direction of the wafer, but has a limitation in increasing the uniformity of films in the radial direction of the wafer, and uniformity in the radial direction is considered more important as the wafer diameter increases.

SUMMARY OF THE INVENTION

Accordingly, an object of the present invention is to provide a gas diffuser for semiconductor device fabrication and a reaction furnace having the gas diffuser which are adapted to enhance the uniformity of films deposited on the surface of a wafer in order to increase the precision and yield of the process.

To accomplish the object, the gas diffuser comprises: a hermetic cylinder with a hollow formed therein; a gas inlet opened upward disposed in an upper side of the hermetic cylinder for a gas to flow into the hollow; a disk-shaped diffusion plate disposed in a lower side of the hermetic cylinder; and a plurality of nozzles to guide and control the stream of the gas pouring out of the hollow, wherein the thickness of the diffusion plate increases with radial distance from the center thereof, such that lengths of the nozzles through which the gas passes also increases with radial distance from the center of the diffusion plate.

The thickness of the diffusion plate increases in proportion to the radial distance from the center of the diffusion plate, or in proportion to the square of the radial distance from the center of the diffusion plate, or in proportion to a repetitive multiple of the radial distance from the center of the diffusion plate with a degree of 2 or greater.

In the gas diffuser, the diffusion plate has a lower surface which is flat and horizontally disposed, and the nozzles are straight tubes which pierce the diffusion plate perpendicular to the lower surface thereof. Further, the nozzles have an identical radius, and the gas which passes through the hermetic cylinder is an etching gas or a vapor deposition gas.

Furthermore, the gas diffuser according to the present invention comprises: a hermetic cylinder with a hollow formed therein; a gas inlet opened upward disposed in an upper side of the hermetic cylinder for a gas to flow into the hollow; a disk-shaped diffusion plate disposed in the lower side of the hermetic cylinder; and a plurality of nozzles formed in the diffusion plate to direct and control the stream of the gas pouring out of the hollow, wherein a velocity distribution of diffused gas at a position directly under the diffusion plate and spaced a radial distance "r" from a position directly under the center of the diffusion plate is $V(r)=V_0((r/r_0)^2-1)$, where $r_0$ is a radius of the diffusion plate, and $V_0$ is a velocity of gas at the point directly under the center of the diffusion plate.

In addition, the gas diffuser according to the present invention comprises: a hermetic cylinder with a hollow formed therein; a gas inlet opened upward disposed in an upper side of the hermetic cylinder for a gas to flow into the hollow; a disk-shaped diffusion plate disposed in the lower side of the hermetic cylinder; and a plurality of nozzles formed in the diffusion plate to direct and control the stream of the gas pouring out of the hollow, wherein the distance in a radial direction of the diffusion plate between radially adjacent nozzles decreases and then increases as radial distance between the nozzles and the center of the diffusion plate increases, such that density of nozzles is low in the center of the diffusion plate, high at a distance from the center of the diffusion plate, and then low again toward peripheral edges of the diffusion plate.

In the gas diffuser, a decrement or increment of the distance between radially adjacent nozzles is proportional to the radial distance from the center of the diffusion plate, or is proportional and to a repetitive multiple of the radial distance from the center of the diffusion plate with a degree of 2 or greater (i.e., the radial distance squared, cubed, etc.).

Furthermore, the gas diffuser according to the present invention comprises: a hermetic cylinder with a hollow formed therein; a gas inlet opened upward disposed in an upper side of the hermetic cylinder for a gas to flow into the hollow; a disk-shaped diffusion plate disposed in the lower side of the hermetic cylinder; and a plurality of nozzles formed in the diffusion plate to direct and control the stream of the gas pouring out of the hollow, wherein a concentration distribution of diffused gas at a defined position directly under the diffusion plate and spaced a radial distance "r" from a position directly under the center of the diffusion plate is $$C(r) = \sum_{k=1}^{N_k} a_k \varphi_k(r),$$

where $\omega_k(r)$ is the Chebyshev polynomial, $N_k$ is the number of the polynomials, and $a_k$ is the proportional constant, wherein $\omega_k(r)$ represents the Chebyshev polynomial of 2(k-1) order because the polynomial used in the expression is of an even order in consideration of the geometrical form and symmetric points with respect to a boundary position at r=0.

Preferably, the distance in a radial direction of the diffusion plate between radially adjacent nozzles decreases and then increases as radial distance between the nozzles and the center of the diffusion plate increases, such that density of nozzles is low in the center of the diffusion plate, high at a distance from the center of the diffusion plate, and then low again toward peripheral edges of the diffusion plate.

In addition, the gas diffuser according to the present invention comprises: a hermetic cylinder with a hollow formed therein; a gas inlet opened upward disposed in an upper side of the hermetic cylinder for a gas to flow into the hollow; a disk-shaped diffusion plate disposed in the lower side of the hermetic cylinder; and a plurality of nozzles formed in the diffusion plate to direct and control the stream of the gas pouring out of the hollow, wherein the thickness of the diffusion plate increases with radial distance from the center thereof, such that lengths of the nozzles through which the gas passes also increase with radial distance from the center of the diffusion plate, and wherein the radial distance between radially adjacent nozzles decreases and then increases as the radial distance between the nozzles and the center of the diffusion plate increases, such that density of nozzles is low in the center of the diffusion plate, high at a distance from the center of the diffusion plate, and then low again toward peripheral edges of the diffusion plate.

Also, the gas diffuser according to the present invention comprises: a hermetic cylinder with a hollow formed therein; a gas inlet opened upward disposed in an upper side of the hermetic cylinder for a gas to flow into the hollow; a disk-shaped diffusion plate being in the lower side of the hermetic cylinder; and a plurality of nozzles formed in the diffusion plate to direct and control the stream of the gas pouring out of the hollow, wherein a velocity distribution of diffused gas at a position directly under the diffusion plate and spaced a radial distance "r" from a position directly under the center of the diffusion plate is $V(r)=V_0((r/r_0)^2-1)$, where $r_0$ is the radius of the diffusion plate, and $V_0$ is a velocity of gas at the position directly under the center of the diffusion plate. In addition, a concentration distribution of diffused gas at a position directly under the diffusion plate and space a radial distance "r" from a position directly under the center of the diffusion plate is $$C(r) = \sum_{k=1}^{N_k} a_k \varphi_k(r),$$

where $\omega_k(r)$ is the Chebyshev polynomial, $N_k$ is the number of the polynomials, and $a_k$ is the proportional constant, wherein $\omega_k(r)$ represents the Chebyshev polynomial of 2(k-1) order because the polynomial used in the expression is of an even order in consideration of the geometrical form and symmetric points with respect to a boundary position at r=0.

It is also an object of the present invention to provide a reaction furnace for fabricating a semiconductor device, comprising: a gas diffuser disposed in an upper portion of the reaction furnace for injecting a gas onto the surface of a wafer; and a support plate disposed in a lower portion of the reaction furnace for supporting the wafer, wherein the gas diffuser comprises: a hermetic cylinder with a hollow formed therein; a gas inlet opened upward disposed in an upper side of the hermetic cylinder for the gas to flow into the hollow; a disk-shaped diffusion plate disposed in a lower side of the hermetic cylinder; and a plurality of nozzles formed in the diffusion plate to direct and control the stream of the gas pouring out of the hollow. The thickness of the diffusion plate increases with radial distance from the center thereof, such that lengths of the nozzles through which the gas passes also increase with radial distance from the center of the diffusion plate. The diffusion plate is disposed in the upper portion of the reaction furnace and is spaced from the surface of the wafer by a distance equal to half the radius of the wafer, or by a distance equal to the radius of the wafer.

BRIEF DESCRIPTION OF THE ATTACHED DRAWINGS

These and other objects, features and advantages of the present invention will become more apparent from the following detailed description of the preferred embodiment thereof made with reference to the accompanying drawings, of which:

Figure 20A:
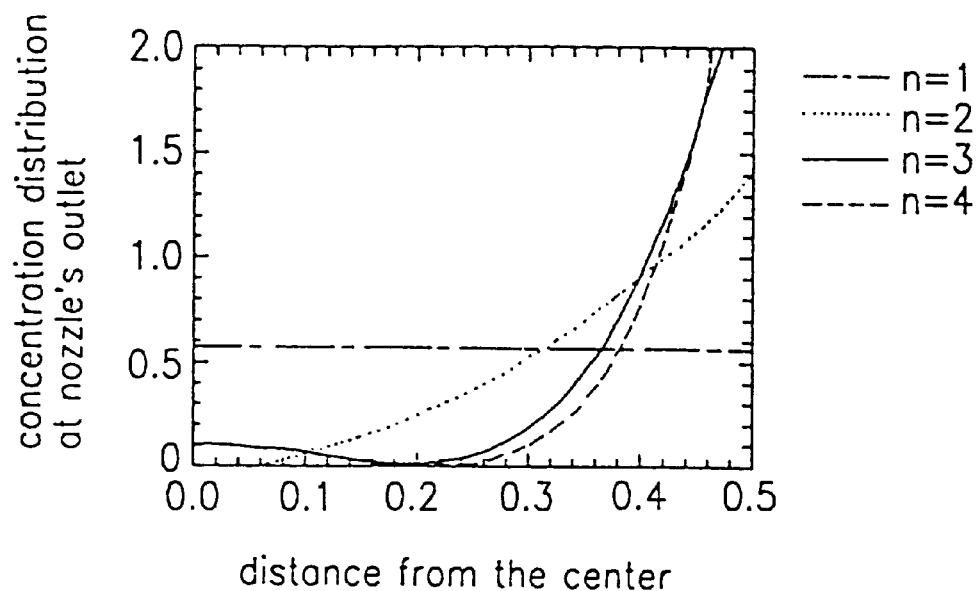
Figure 20B:
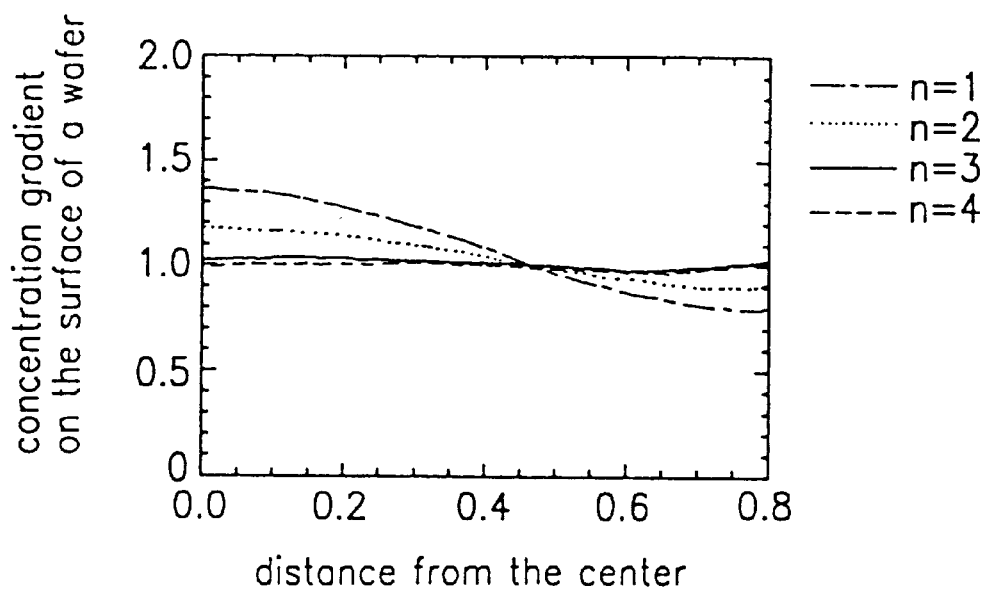
Figure 21A:
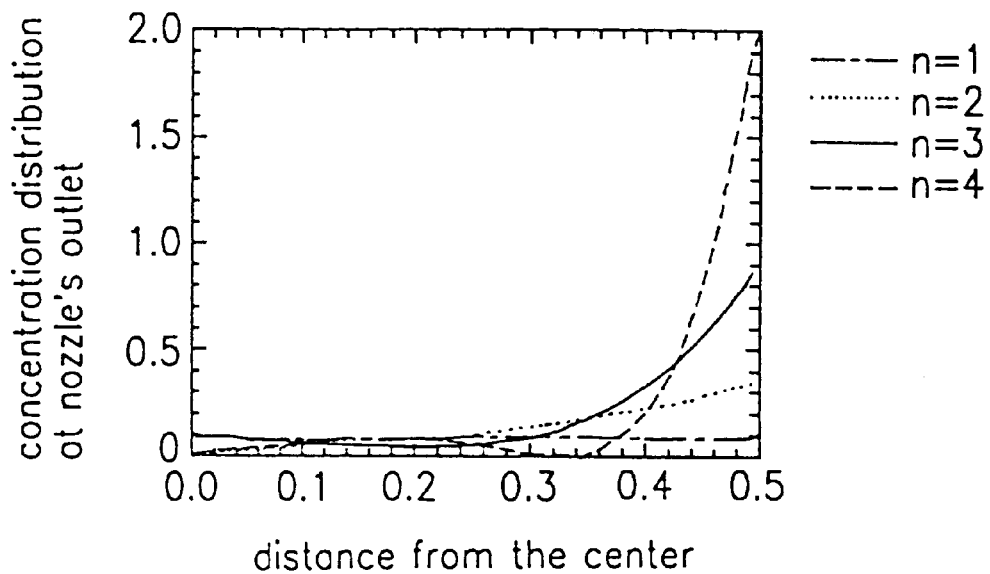
Figure 21B:
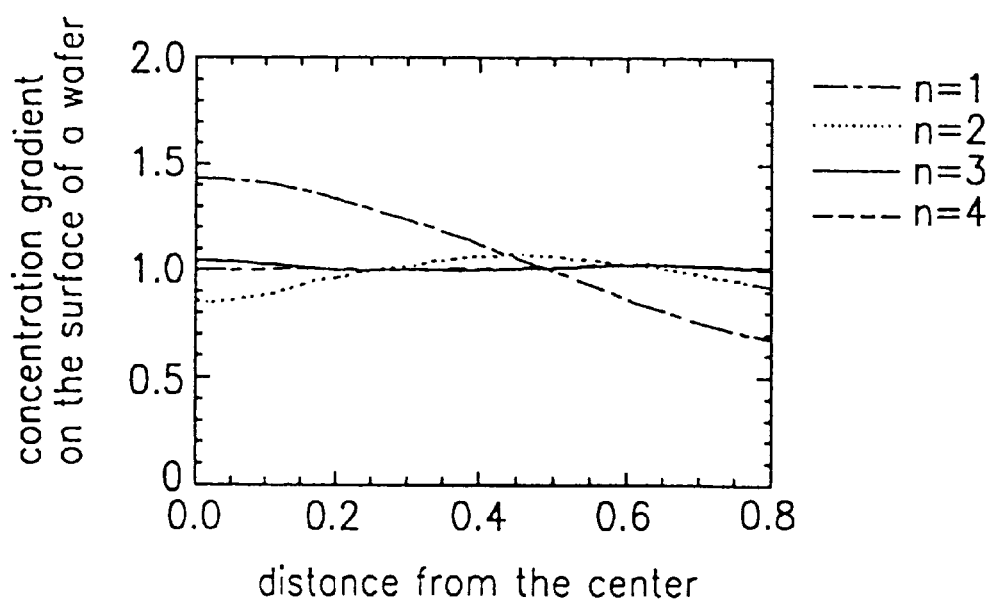

FIGS. 20A and 20B are diagrams showing a concentration distribution of gas at the nozzle's outlet and a concentration gradient on the surface of the wafer after a numerical analysis varying the number of polynomials of the gas diffuser when the Re number is 10 in case B, respectively; and FIGS. 21A and 21B are diagrams showing a concentration distribution of gas at the nozzle's outlet and a concentration gradient on the surface of the wafer after a numerical analysis varying the number of polynomials of the gas diffuser when the Re number is 100 in case B, respectively.

DETAILED DESCRIPTION OF THE PREFERRED EMBODIMENT

Hereinafter, a preferred embodiment of the present invention will be described in detail with reference to the accompanying drawings.

Figure 1:
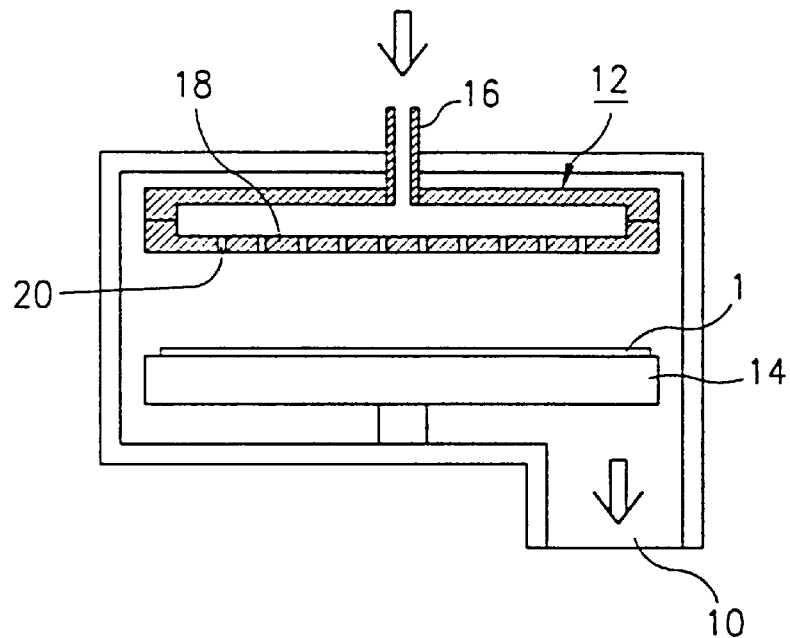
FIG. 1 is a side view showing a reaction furnace with a conventional gas diffuser shown in cross-section.
Figure 2:
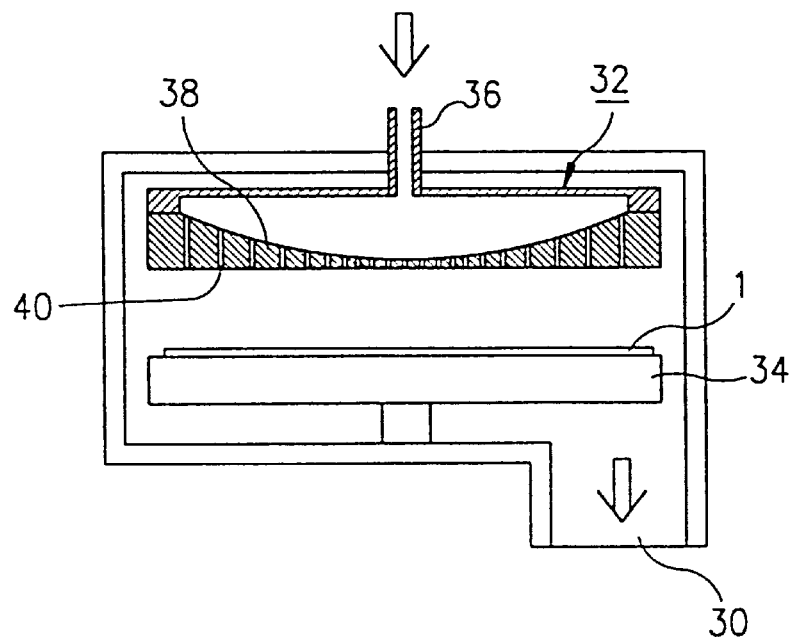
FIG. 2 is a side view showing a reaction furnace with a gas diffuser of the present invention shown in cross-section.

Referring to FIG. 2, a gas diffuser 32 is disposed in the upper portion of a reaction furnace for semiconductor device fabrication. The reaction furnace has an exhaust hole 30 formed to discharge gas downwards and a support plate 34 for supporting a wafer 1 in the lower portion of the furnace. The exhaust hole is positioned below the wafer 1, and gas is discharged downwardly using a vacuum pressure. Preferably, the gas diffuser 32 is spaced above the surface of the wafer 1 by a distance equal to half the radius of the wafer, or equal to the radius of the wafer. The gas used in the furnace may be either an etching gas or a vapor deposition gas.

The gas diffuser 32 has the form of a hermetic cylinder with a hollow formed inside. The gas diffuser 32 has an upper side above the hollow, with a gas inlet 36 opened upward for the gas to enter the hollow, and a lower side below the hollow, with a disk-shaped diffusion plate 38 having a plurality of nozzles 40 to guide and control the stream of gas pouring out of the hollow. The thickness of the diffusion plate 38 increases in the radial direction from a minimum at the center thereof to a maximum at its peripheral edges, such that the length of the nozzles 40 through which the gas passes increases in the radial direction.

The incremental increase in thickness of the diffusion plate 38 is proportional to the radial distance from the center of the diffusion plate, is proportional to the square of the distance from the center, or is proportional to a repetitive multiple of the distance with a degree greater than two.

The lower surface of the diffusion plate 38 is flat and horizontally disposed, and the nozzles 40 piercing the diffusion plate 38 are straight tubes which are perpendicular to the flat lower outside surface. Preferably, the nozzles 40 have an identical radius.

Figure 3:
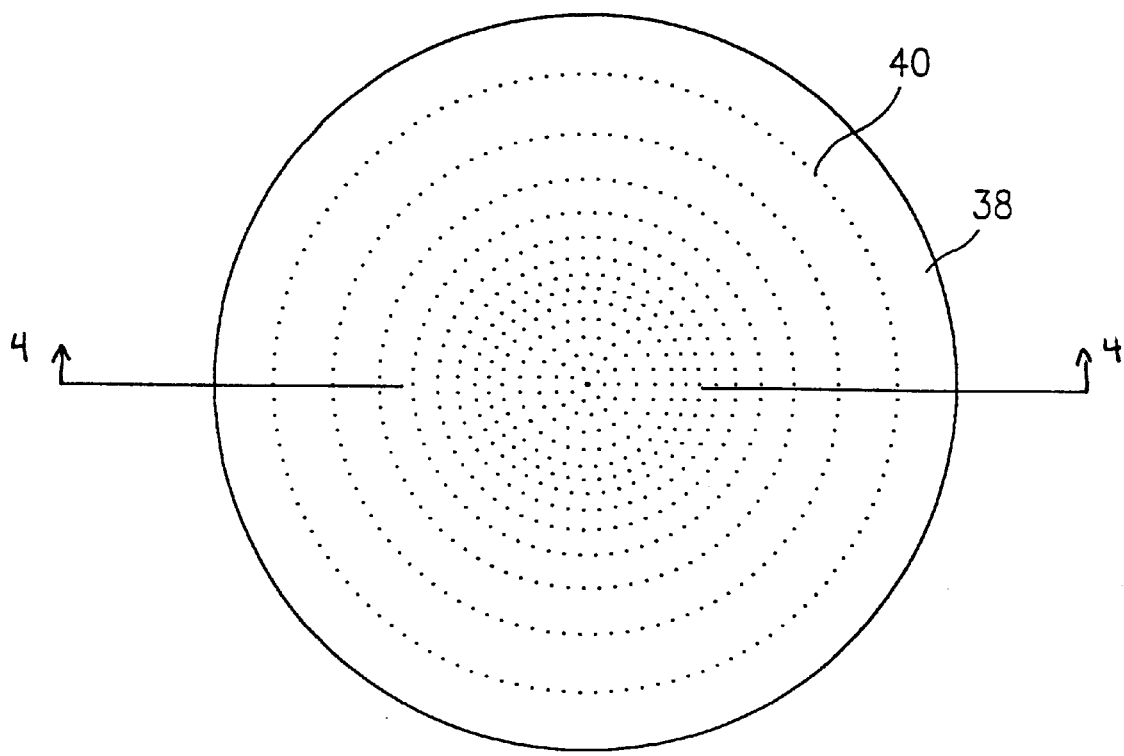
FIG. 3 is a bottom view of the gas diffuser in FIG. 2.

As illustrated in FIG. 3, the radial distance between pairs of radially adjacent nozzles 40 decreases gradually and then increases as their distance from the center increases. Therefore, the density of nozzles 40 is low in the center of the diffusion plate, high at a distance from the center of the diffusion plate, and then low again toward the peripheral edges of the diffusion plate 38.

The decrement or increment of the radial distance between the nozzles 40 in the diffusion plate 38 is proportional to radial distance from the center of the diffusion plate, or is proportional to the square of the distance from the center of the diffusion plate 38, or is proportional to a repetitive multiple of the distance with a degree greater than two.

Figure 5:
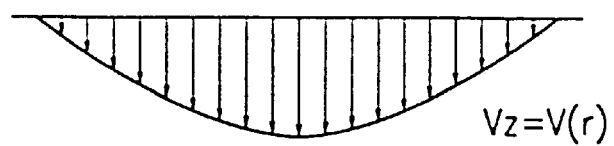
FIG. 5 is a graph of gas velocity distribution across the outlets of nozzles of the gas diffuser in FIG. 2.

To explain the operation of the gas diffuser 32 for semiconductor device fabrication as described above, a velocity distribution as illustrated in FIG. 5 is obtained. In this velocity distribution, the velocity at the nozzle's outlet varies with radial position on the diffusion plate 38 as a function of the thickness of the diffusion plate 38 at each radial position.

Figure 4:
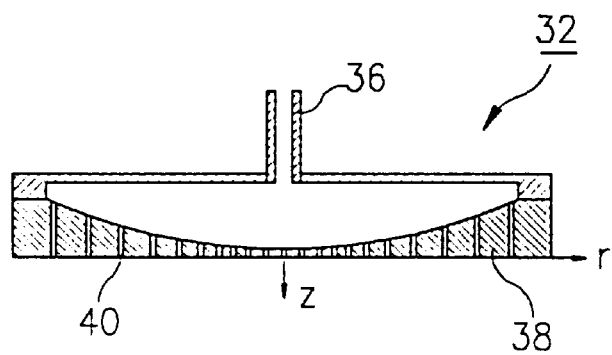
FIG. 4 is a cross-sectional view taken along the line 4—4 in FIG. 3.

That is, if a velocity distribution at a defined position "r" in the radial direction is intended to be $V(r)=V_0((r/r_0)^2-1)$ with the coordinates as shown in FIG. 4, the thickness of the diffusion plate 38 has to be made in the form of a quadratic function. The design variable in this case is a single $V_0$ (where r is the distance from the center of the diffusion plate to a defined position in the radial direction, $r_0$ is the radius of the diffusion plate, and $V_0$ is the velocity at the nozzle's outlet in the center of the diffusion plate).

When the thickness of the diffusion plate 38 in the radial direction is made in the form of a quadratic function, the nozzles 40 in the center are short to provide less pressure drop and inject the gas at high speed, and those at the peripheral edges are long to cause a large pressure drop, injecting the gas at low speed.

It is possible to obtain a desired speed in the radial direction by varying the length of nozzles 40 since the pressure drop is proportionate to the length of the path through the nozzle.

Figure 6:
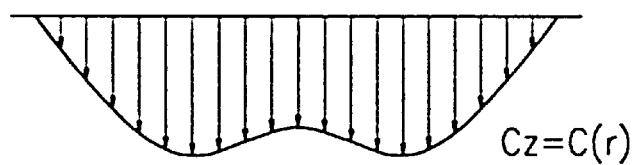
FIG. 6 is a graph of the gas density distribution across the outlets of the nozzles of the gas diffuser in FIG. 2.

Furthermore, as shown in FIG. 6, a concentration distribution of gas injected varies in the radial direction of the diffusion plate 38 as a function of the density of nozzles 40.

That is, the concentration distribution directly under the diffusion plate at a defined position r as shown in FIG. 6 is obtained in an application of the Chebyshev polynomial expression such as $$C(r) = \sum_{k=1}^{N_k} a_k \varphi_k(r),$$

where $\omega_k(r)$ is the Chebyshev polynomial, $N_k$ is the number of polynomials and $a_k$ is the proportional constant.

As the polynomial used in the expression is of an even order in consideration of the geometrical form and symmetric points with respect to a boundary position at r=0, $\omega_k(r)$ represents the Chebyshev polynomial of 2(k-1) order. The design variable in this case is a single $N_k$. A desired concentration distribution of gas in the radial direction of the diffusion plate at the nozzles' outlets can be realized by arranging the nozzles of the gas diffuser of the present invention in a density based on the above expression.

The velocity distribution in the radial direction can be employed in a manner independent of the concentration distribution, and it is also possible to confirm the results which would be obtained using the gas diffuser of the present invention in a reaction furnace through a numerical analysis with a computer by minimizing the number of design variables in the gas diffuser. Such a numerical analysis allows for trial and error and makes it possible to have an optimized design in a short period of time. The results of such a numerical analysis will be described below with reference to FIGS. 7 through 21B.

Figure 7:
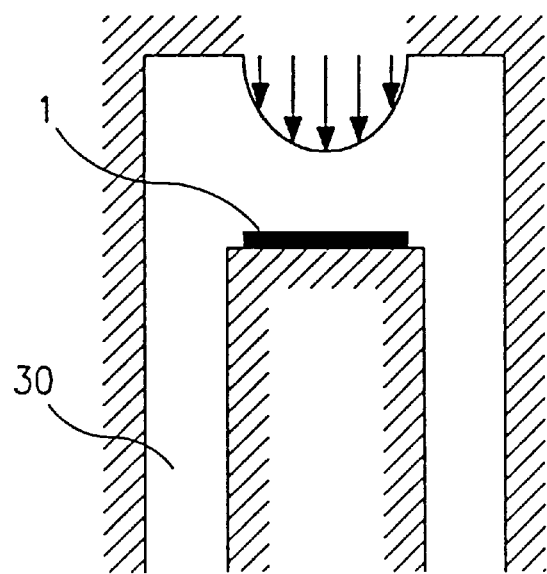
FIG. 7 is a schematic view of a simplified reaction furnace used for numerical analysis of the gas diffuser of the present invention.

FIG. 7 is a schematic view of a simplified reaction furnace in which gas flows onto the surface of a wafer 1 and is discharged through an exhaust hole 30. This simplified reaction furnace is divided into parts required for the numerical analysis using a lattice system as shown in FIGS. 8 and 9.

Figure 8:
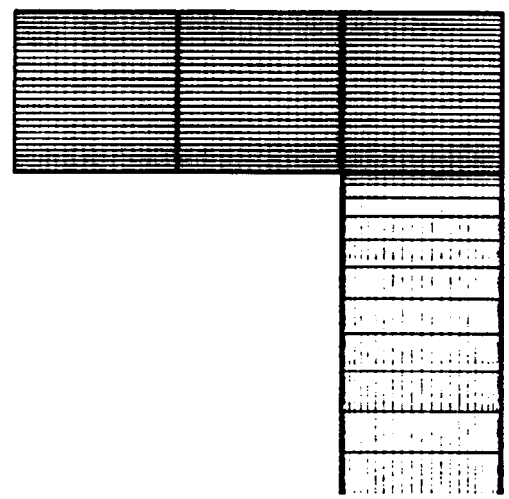
FIG. 8 is a diagram illustrating a lattice system for numerical analysis of the reaction furnace where the distance from the nozzle's outlet to a wafer is half the radius of the wafer (case A)
Figure 9:
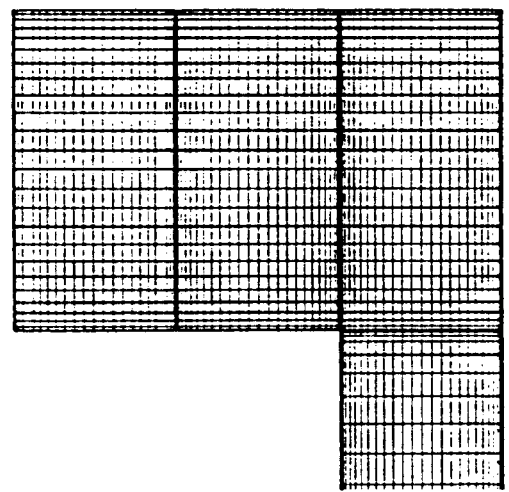
FIG. 9 is a diagram illustrating a lattice system for numerical analysis of the reaction furnace where the distance from the nozzle's outlet to the wafer is equal to the radius of the wafer (case B)

The lattice system shown in FIG. 8 is designed such that the distance from the nozzle's outlet to the wafer is half the radius of the wafer (case A). The lattice system shown in FIG. 9 is designed such that the distance from the nozzle's outlet to the wafer is equal to the radius of the wafer (case B).

The numerical analysis is performed separately in cases A and B in order to analogize the effect of the gas diffuser based on its distance from the wafer.

The numerical analysis for flow and concentration uses the FVM (Finite Volume Method), and the optimization of design variables $V_0$ and $N_k$ is realized through the local random search technique.

Figure 10A:
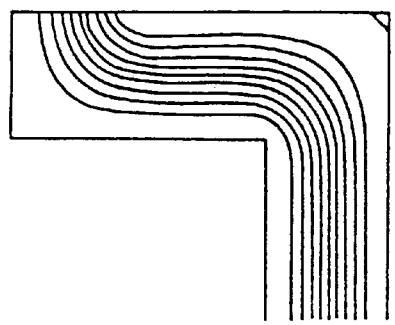
FIGS. 10A–10C illustrate gas stream lines after a numerical analysis when the ratio of the initial fluid inlet velocity at the wafer to the coefficient of viscosity of the gas, that is the Re number, is 1, 10 and 100, in case A, respectively.
Figure 10B:
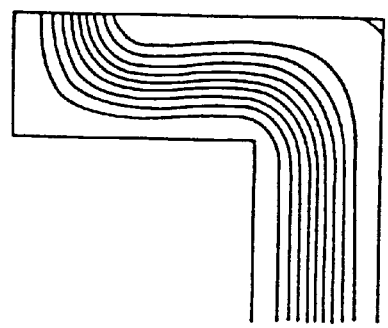
Figure 10C:
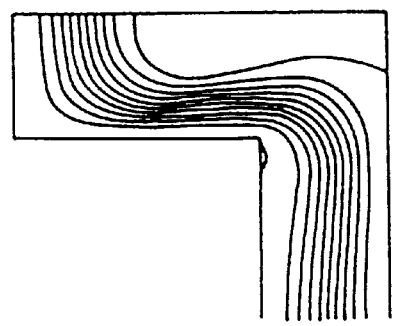

FIGS. 10A–10C illustrate gas stream lines after a numerical analysis when the ratio of the initial fluid inlet velocity at the wafer to the coefficient of viscosity of the gas, that is, Re number is 1, 10 and 100 in case A, respectively. It is apparent from FIGS. 10A–10C that the gas stream lines get out of order with an increase in the injection velocity at the nozzle's outlet (as the Re number increases).

Figure 11A:
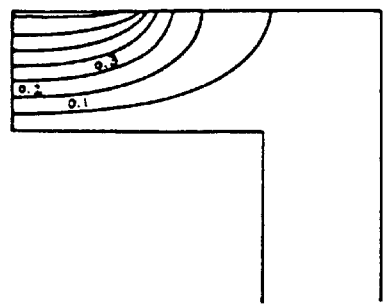
FIGS. 11A–11C are diagrams showing a concentration distribution of gas after a numerical analysis with the conventional gas diffuser for semiconductor device fabrication when the Re number is 1, 10 and 100 in case A, respectively.
Figure 11B:
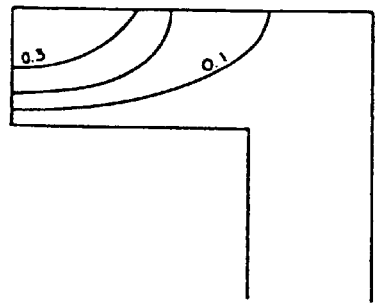
Figure 11C:
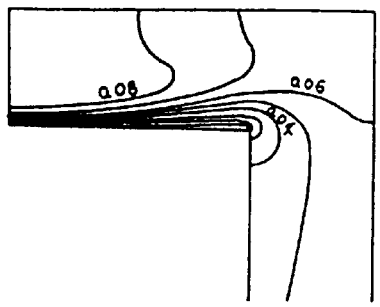

FIGS. 11A–11C are diagrams showing a concentration distribution of gas after a numerical analysis with a conventional gas diffuser for semiconductor device fabrication when the Re number is 1, 10 and 100 in case A, respectively.

Figure 12A:
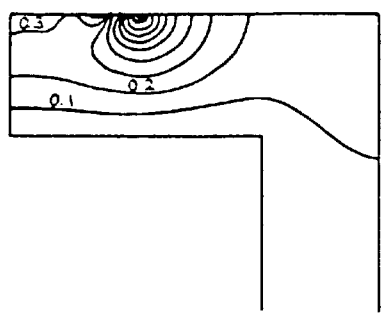
FIGS. 12A–12C are diagrams showing a concentration distribution of gas after a numerical analysis with the novel gas diffuser for semiconductor device fabrication when the Re number is 1, 10 and 100 in case A, respectively.
Figure 12B:
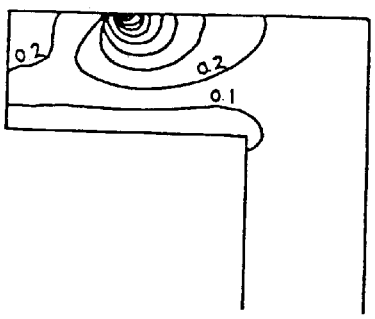
Figure 12C:
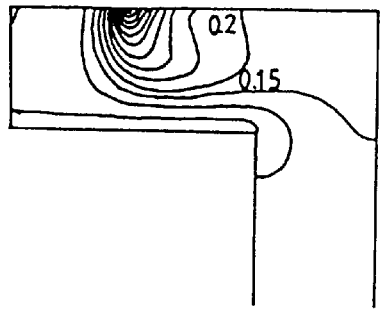

FIGS. 12A–12C are diagrams showing a concentration distribution of gas after a numerical analysis with the gas diffuser of the present invention when the Re number is 1, 10 and 100 in case A, respectively.

Compared with FIGS. 12A–12C, FIGS. 11A–11C show that a conventional gas diffuser provides a gas density which is relatively high in the center of the wafer and low at the peripheral edges of the wafer, so that the film formed in the center of the wafer is thick but the film at the peripheral edges of the wafer is relatively thin.

However, as illustrated in FIG. 12, the gas diffuser of the present invention can diffuse the gas uniformly all over the wafer and a uniform film is expected to be formed on the whole surface of the wafer.

Meanwhile, comparing FIGS. 11A, 11B, and 11C with FIGS. 12A, 12B, and 12C, respectively, it is shown that the gas density becomes uniform in the vicinity of the wafer with increasing injection velocity at the nozzle's outlet (i.e., as the Re number increases).

Figure 13A:
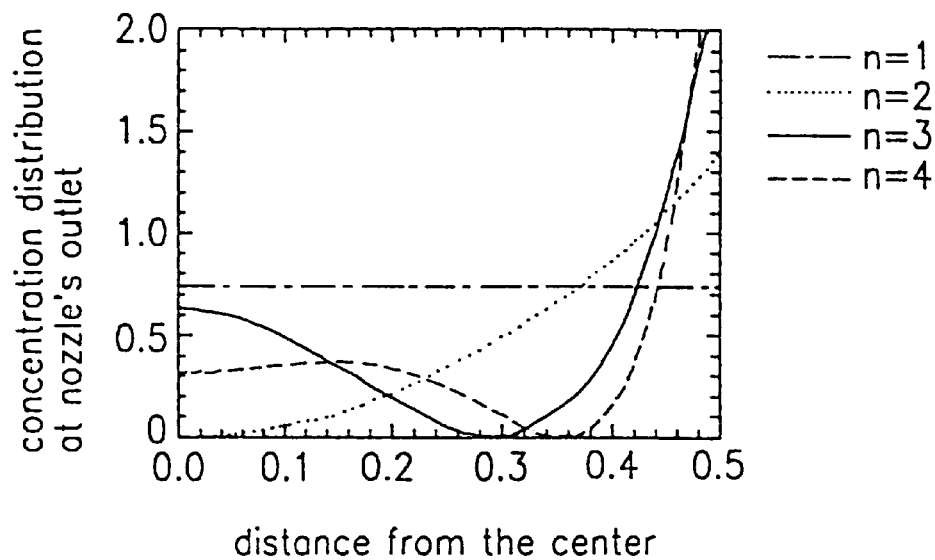
FIGS. 13A and 13B are diagrams showing a concentration distribution of gas at the nozzle's outlets and a concentration gradient on the surface of the wafer after a numerical analysis varying the number of polynomials of the gas diffuser when the Re number is 1 in case A, respectively.
Figure 13B:
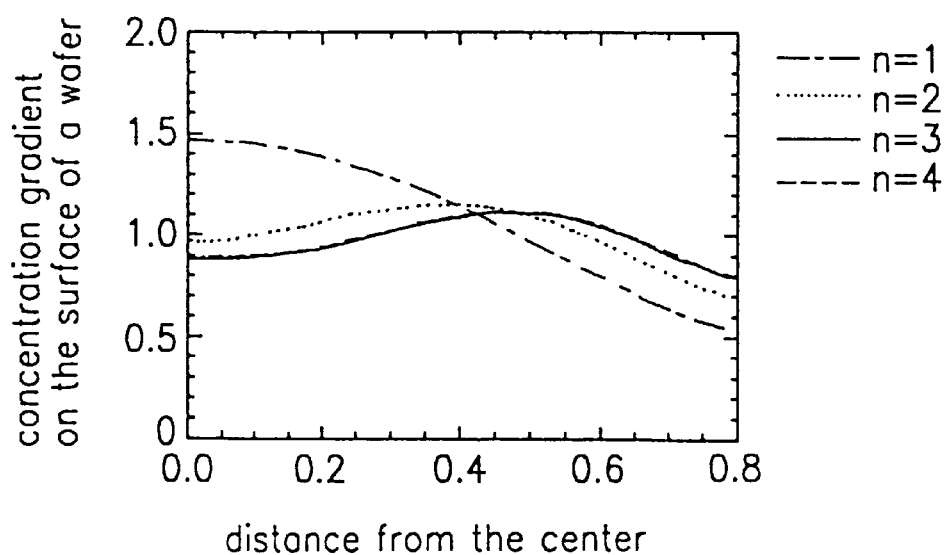

On the other hand, FIGS. 13A and 13B are diagrams showing a concentration distribution of gas at the nozzle's outlet and a concentration gradient on the surface of the wafer after a numerical analysis varying the number of polynomials of the gas diffuser when the Re number is 1 in case A, respectively.

Figure 14A:
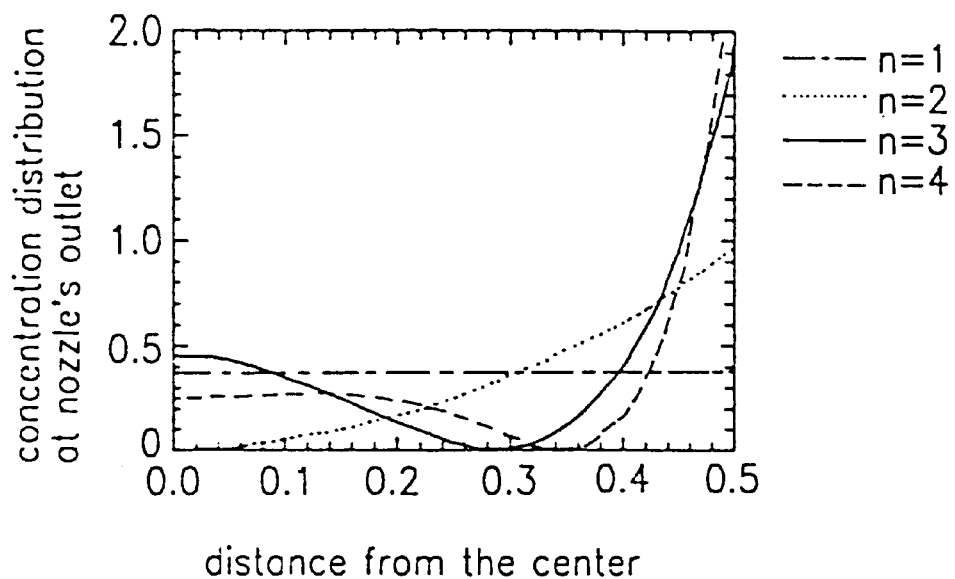
FIGS. 14A and 14B are diagrams showing a concentration of gas at the nozzle's outlet and a concentration gradient on the surface of the wafer after a numerical analysis varying the number of polynomials of the gas diffuser when the Re number is 10 in case A, respectively.
Figure 14B:
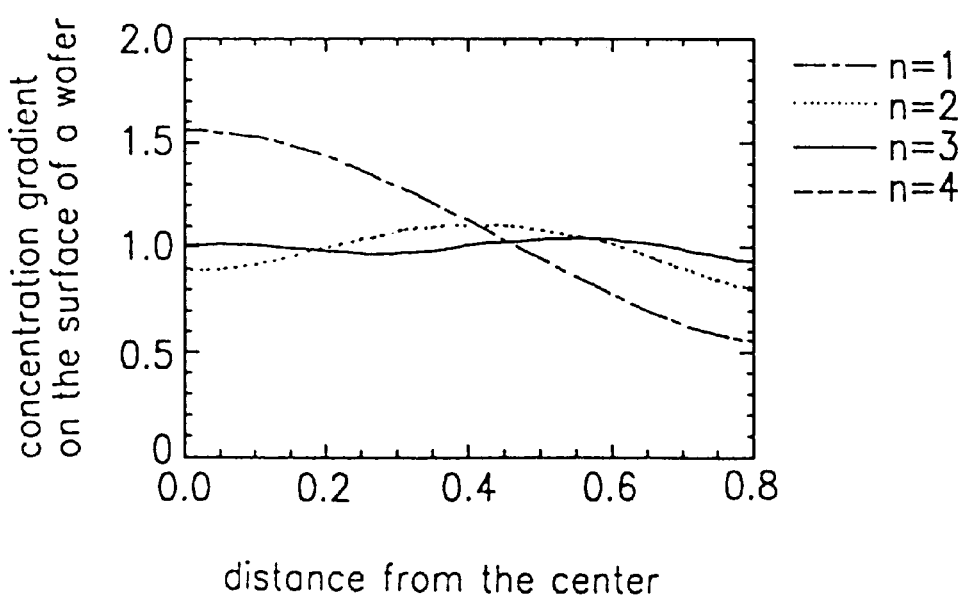

FIGS. 14A and 14B are diagrams showing a concentration distribution of gas at the nozzle's outlet and a concentration gradient on the surface of the wafer after a numerical analysis varying the number of polynomials of the gas diffuser when the Re number is 10 in case A, respectively.

Figure 15A:
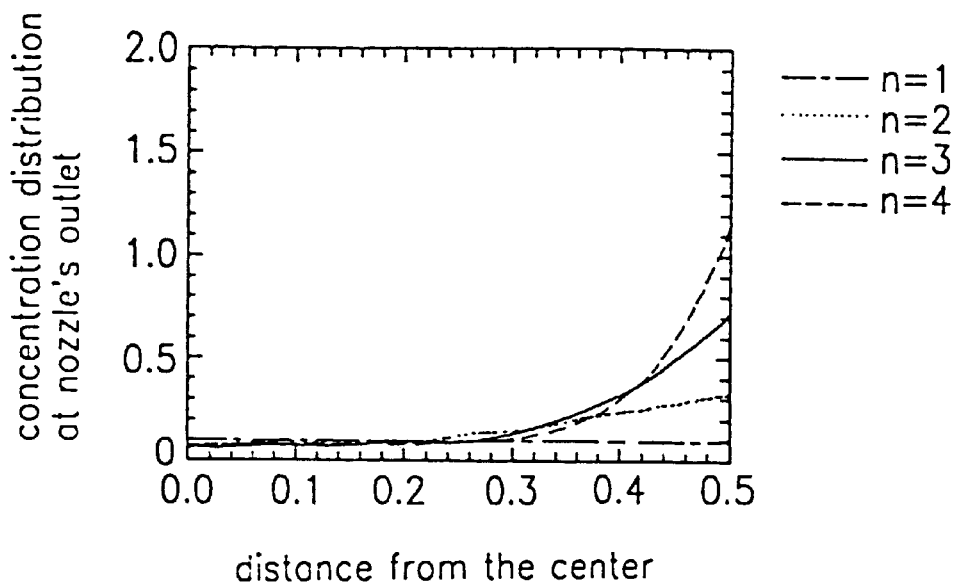
FIGS. 15A and 15B are diagrams showing a concentration distribution of gas at the nozzle's outlet and a concentration gradient on the surface of the wafer after a numerical analysis varying the number of polynomials of the gas diffuser when the Re number is 100 in case A, respectively.
Figure 15B:
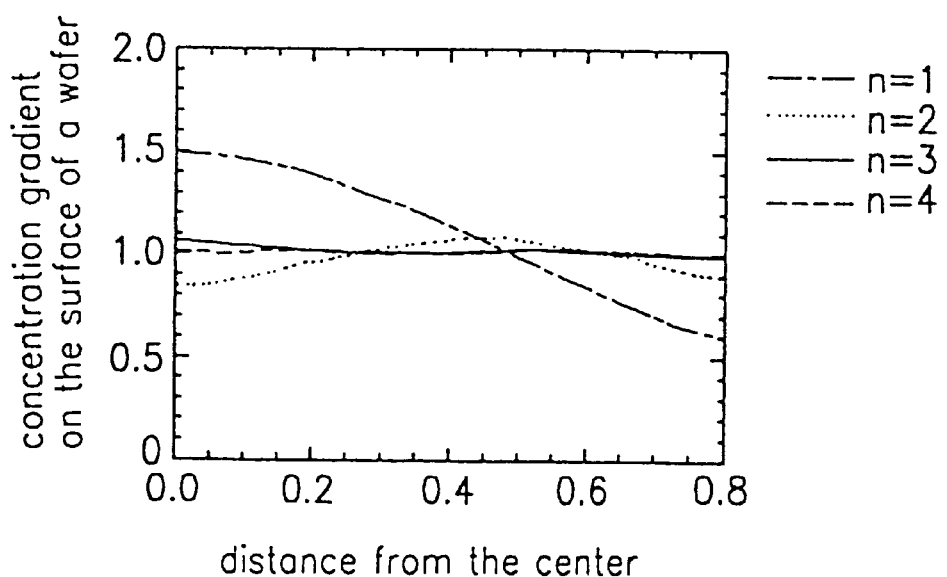

FIGS. 15A and 15B are diagrams showing a concentration distribution of gas at the nozzle's outlet and a concentration gradient on the surface of the wafer after a numerical analysis varying the number of polynomials of the gas diffuser when the Re number is 100 in case A, respectively.

To compare FIGS. 13A and 13B to FIGS. 14A and 14B and FIGS. 15A and 15B, respectively, it can be seen that the gas density decreases in the center of the wafer surface with the conventional gas diffuser where the number of polynomials is unity (n=1), that is, the gas density is uniform at the nozzle's outlet, while it is uniformly diffused all over the surface of the wafer with the gas diffuser of the present invention where the number of polynomials is greater than three and the gas density is low at the nozzle's outlet in the center of the diffusion plate.

As it is apparent from FIGS. 13A–15B, the effect of the present invention is enhanced with an increase in the injection velocity of gas at the nozzle's outlet, that is, an increase in the Re number.

The results of a numerical analysis for the gas diffuser of the present invention for case B where the distance from the nozzle to the wafer is doubled relative to case A are given below.

Figure 16A:
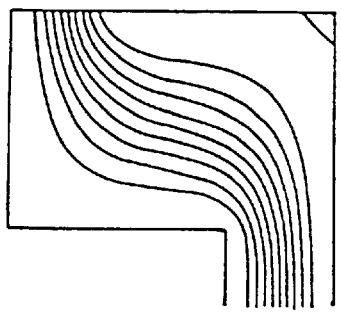
FIGS. 16A–16C illustrate gas stream lines after a numerical analysis when the ratio of the initial fluid inlet velocity at the wafer to the coefficient of viscosity of the gas, when the Re number is 1, 10 and 100 in case B, respectively.
Figure 16B:
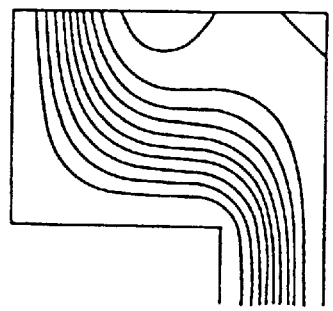
Figure 16C:
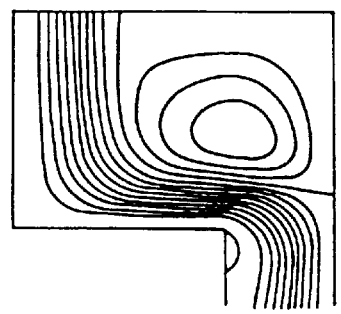

FIGS. 16A–16C illustrate gas stream lines after a numerical analysis when the ratio of the initial fluid inlet velocity at the wafer to the coefficient of viscosity of the gas, that is, Re number is 1, 10 and 100 in case B, respectively.

As shown in the figures, it is apparent that the gas stream lines get out of order with an increase in the injection velocity at the nozzle's outlet (as the Re number increases) and a turbulent flow interval occurs when the Re number is 100.

Figure 17A:
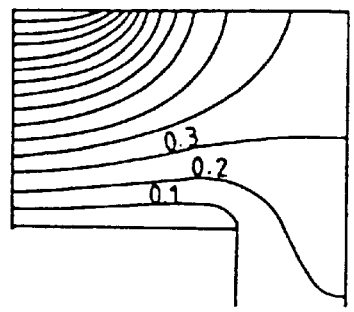
FIGS. 17A–17C are diagrams showing a concentration distribution of gas after a numerical analysis with the conventional gas diffuser for semiconductor device fabrication when the Re number is 1, 10 and 100 in case B, respectively.
Figure 17B:
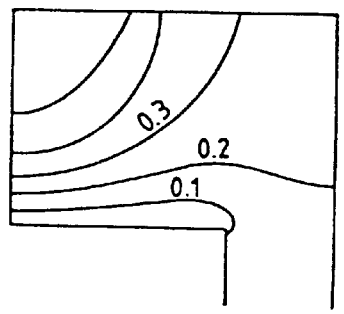
Figure 17C:
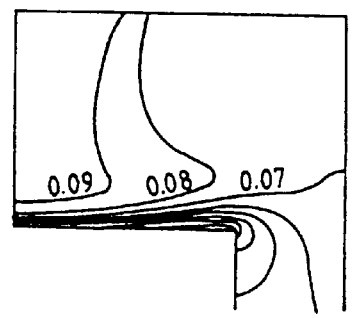

FIGS. 17A–17C are diagrams showing a concentration distribution of gas after a numerical analysis with a conventional gas diffuser when the Re number is 1, 10 and 100 in case B, respectively.

Figure 18A:
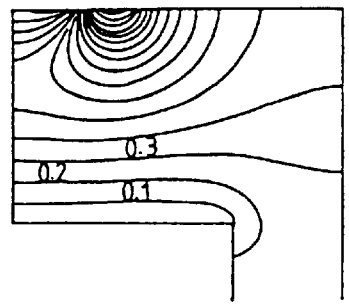
FIGS. 18A–18C are diagrams showing a concentration distribution of gas after a numerical analysis with the novel gas diffuser for semiconductor device fabrication when the Re number is 1, 10 and 100 in case B, respectively.
Figure 18B:
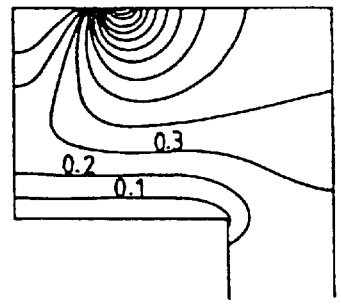
Figure 18C:
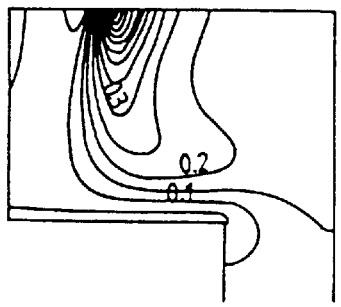

FIGS. 18A–18C are diagrams showing a concentration distribution of gas after a numerical analysis with the gas diffuser of the present invention when the Re number is 1, 10 and 100 in case B, respectively.

Compared with FIGS. 18A–18C, FIGS. 17A–17C show that the conventional gas diffuser provides a gas density relatively high in the center of the wafer and low at the peripheral edges of the wafer, so that the film formed in the center of the wafer is relatively thick but the film at the peripheral edges of the wafer is thin.

However, as illustrated in FIGS. 18A–18C, the gas diffuser of the present invention can diffuse the gas uniformly all over the wafer and a uniform film is expected to be formed on the whole surface of the wafer.

A comparison of FIGS. 17A–17C and FIGS. 18A–18C, respectively, shows that the gas density becomes uniform in the vicinity of the wafer with increasing injection velocity at the nozzle's outlet (i.e, increasing Re number).

When comparing FIGS. 17A–17C and 18A–18C (case B) with FIGS. 11A–11C and 12A–12C (case A), it is apparent that the uniformity of gas density is improved when the distance from the nozzle to the wafer is increased.

Figure 19A:
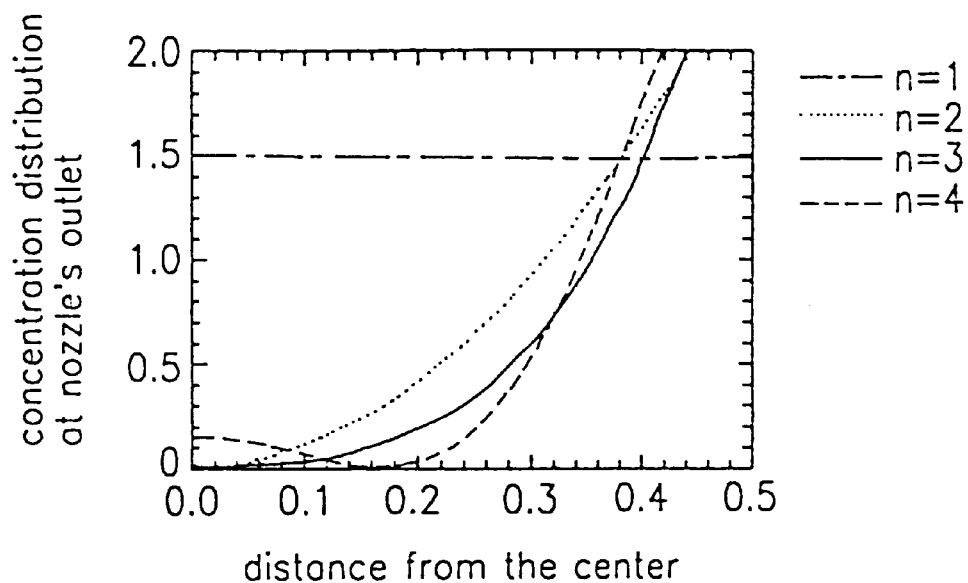
FIGS. 19A and 19B are diagrams showing a concentration distribution of gas at the nozzle's outlet and a concentration gradient on the surface of the wafer after a numerical analysis varying the number of polynomials of the gas diffuser when the Re number is 1 in case B, respectively.
Figure 19B:
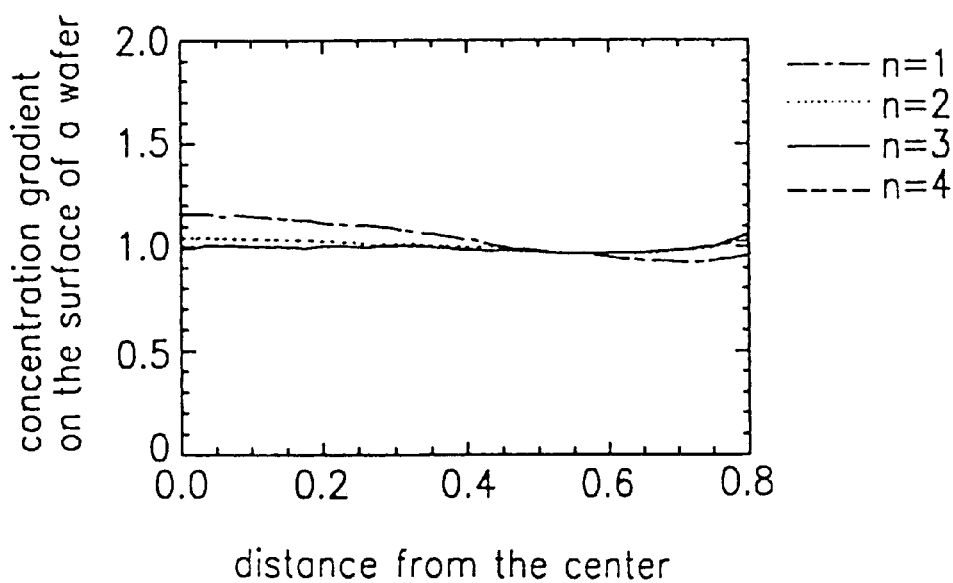

FIGS. 19A and 19B are diagrams showing a concentration distribution of gas at the nozzle's outlet and a concentration gradient on the surface of the wafer after a numerical analysis varying the number of polynomials of the gas diffuser when the Re number is 1 in case B, respectively.

FIGS. 20A and 20B are diagrams showing a concentration distribution of gas at the nozzle's outlet and a concentration gradient on the surface of the wafer after a numerical analysis varying the number of polynomials of the gas diffuser when the Re number is 10 in case B, respectively.

FIGS. 21A and 21B are diagrams showing a concentration distribution of gas at the nozzle's outlet and a concentration gradient on the surface of the wafer after a numerical analysis varying the number of polynomials of the gas diffuser when the Re number is 100 in case B, respectively.

To compare FIGS. 19A and 19B to FIGS. 20A and 20B and FIGS. 21A and 21B, respectively, it can be seen that the gas density decreases in the center of the wafer surface with the conventional gas diffuser where the number of polynomials is unity (n=1), that is, the gas density is uniform at the nozzle's outlet, while it is uniformly diffused all over the surface of the wafer with the gas diffuser of the present invention where the number of polynomials is greater than three and the gas density is low at the nozzle's outlet in the center of the diffusion plate.

As is apparent from FIGS. 19A–21B, the effect of the present invention where the number of polynomials is greater than three has no change with an increase in the injection velocity of gas at the nozzle's outlet, that is, an increase in the Re number.

According to the result of the numerical analysis, the gas diffuser of the present invention is more effective as the distance from the nozzle's outlet to the wafer decreases and the effect of the present invention is held constant or enhanced with an increase in the injection velocity of gas at the nozzle's outlet.

Therefore, use of the gas diffuser of the present invention, and a reaction furnace with the gas diffuser, can enhance the uniformity of films deposited on the surface of a wafer, increasing the precision and yield of the process.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A gas diffuser for fabricating a semiconductor device, comprising:
    a hermetic cylinder with a hollow formed therein;
    a gas inlet opened upward disposed in an upper side of the hermetic cylinder for a gas to flow into the hollow;
    a disk-shaped diffusion plate disposed in a lower side of the hermetic cylinder; and
    a plurality of nozzles formed in the diffusion plate to direct and control a stream of the gas pouring out of the hollow,
    wherein a thickness of the diffusion plate increases with radial distance from a center thereof, such that lengths of the nozzles through which the gas passes also increase with radial distance from the center of the diffusion plate.

2. The gas diffuser as defined in claim 1, wherein the thickness of the diffusion plate increases in proportion to the radial distance from the center of the diffusion plate.

3. The gas diffuser as defined in claim 1, wherein the thickness of the diffusion plate increases in proportion to a square of the radial distance from the center of the diffusion plate.

4. The gas diffuser as defined in claim 1, wherein the thickness of the diffusion plate increases in proportion to a repetitive multiple of the radial distance from the center of the diffusion plate with a degree of 2 or greater.

5. The gas diffuser as defined in claim 1, wherein the diffusion plate has a lower surface which is flat and horizontally disposed.

6. The gas diffuser as defined in claim 5, wherein the nozzles are straight tubes which pierce the diffusion plate perpendicular to the lower surface thereof.

7. The gas diffuser as defined in claim 1, wherein the nozzles have an identical radius.

8. The gas diffuser as defined in claim 1, wherein the gas is an etching gas.

9. The gas diffuser as defined in claim 1, wherein the gas is a vapor deposition gas.

10. A gas diffuser for fabricating a semiconductor device, comprising:
a hermetic cylinder with a hollow formed therein;
a gas inlet opened upward disposed in an upper side of the hermetic cylinder for a gas to flow into the hollow;
a disk-shaped diffusion plate disposed in a lower side of the hermetic cylinder; and
a plurality of nozzles formed in the diffusion plate to direct and control a stream of the gas pouring out of the hollow,
wherein a thickness of the diffusion plate increases with radial distance from the center thereof, such that lengths of the nozzles through which the gas passes also increase with radial distance from the center of the diffusion plate, and
a velocity distribution of diffused gas at a position directly under the diffusion plate and spaced a radial distance "r" from a position directly under a center of the diffusion plate is $$V(r) = V_0((r/r_0)^2 - 1),$$

wherein $r_0$ is a radius of the diffusion plate, and $V_0$ is a velocity of gas at the position directly under the center of the diffusion plate.

11. The gas diffuser as defined in claim 10, wherein the diffusion plate has a lower surface which is flat and horizontally disposed.

12. The gas diffuser as defined in claim 10, wherein the gas is an etching gas.

13. The gas diffuser as defined in claim 10, wherein the gas is a vapor deposition gas.

14. A gas diffuser for fabricating a semiconductor device, comprising:
a hermetic cylinder with a hollow formed therein;
a gas inlet opened upward disposed in an upper side of the hermetic cylinder for a gas to flow into the hollow;
a disk-shaped diffusion plate disposed in a lower side of the hermetic cylinder; and
a plurality of nozzles formed in the diffusion plate to direct and control a stream of the gas pouring out of the hollow,
wherein a thickness of the diffusion plate increases with radial distance from the center thereof, such that lengths of the nozzles through which the gas passes also increase with radial distance from the center of the diffusion plate, and
a concentration distribution of diffused gas at a defined position directly under the diffusion plate and spaced a radial distance "r" from a position directly under a center of the diffusion plate is $$C(r) = \sum_{k=1}^{N_k} a_k \varphi_k(r),$$

wherein $\omega_k(r)$ is a Chebyshev polynomial, $N_k$ is a number of polynomials, and $a_k$ is a proportional constant, wherein $\omega_k(r)$ represents a Chebyshev polynomial of $2(k-1)$ order because the polynomial used is of an even order in consideration of geometrical form and symmetric points with respect to a boundary position at $r=0$.

15. The gas diffuser as defined in claim 14, wherein a distance in a radial direction of the diffusion plate between radially adjacent nozzles decreases and then increases as radial distance between the nozzles and the center of the diffusion plate increases, such that density of nozzles is low in the center of the diffusion plate, high at a distance from the center of the diffusion plate, and then low again toward peripheral edges of the diffusion plate.

16. The gas diffuser as defined in claim 14, wherein the diffusion plate has a lower surface which is flat and horizontally disposed.

17. The gas diffuser as defined in claim 16, wherein the nozzles are straight tubes which pierce the diffusion plate perpendicular to the lower surface thereof.

18. The gas diffuser as defined in claim 14, wherein the nozzles have an identical radius.

19. The gas diffuser as defined in claim 14, wherein the gas is an etching gas.

20. The gas diffuser as defined in claim 14, wherein the gas is a vapor deposition gas.

21. A gas diffuser for fabricating a semiconductor device, comprising:
a hermetic cylinder with a hollow formed therein;
a gas inlet opened upward disposed in an upper side of the hermetic cylinder for a gas to flow into the hollow;
a disk-shaped diffusion plate disposed in a lower side of the hermetic cylinder; and
a plurality of nozzles formed in the diffusion plate to direct and control a stream of the gas pouring out of the hollow,
wherein a thickness of the diffusion plate increases with radial distance from a center thereof, such that lengths of the nozzles through which the gas passes also increase with radial distance from the center of the diffusion plate, and
radial distance between radially adjacent nozzles decreases and then increases as radial distance between the nozzles and the center of the diffusion plate increases, such that density of nozzles is low in the center of the diffusion plate, high at a distance from the center of the diffusion plate, and then low again toward peripheral edges of the diffusion plate.

22. The gas diffuser as defined in claim 21, wherein the thickness of the diffusion plate increases in proportion to the radial distance from the center of the diffusion plate.

23. The gas diffuser as defined in claim 21, wherein the thickness of the diffusion plate increases in proportion to a square of the radial distance from the center of the diffusion plate.

24. The gas diffuser as defined in claim 21, wherein the thickness of the diffusion plate increases in proportion to a repetitive multiple of the radial distance from the center of the diffusion plate with a degree of 2 or greater.

25. The gas diffuser as defined in claim 21, wherein a decrement or increment of the distance between radially adjacent nozzles is proportional to the radial distance from the center of the diffusion plate.

26. The gas diffuser as defined in claim 21, wherein a decrement or increment of the distance between radially adjacent nozzles is proportional to a repetitive multiple of the radial distance from the center of the diffusion plate with a degree of 2 or greater.

27. The gas diffuser as defined in claim 21, wherein the diffusion plate has a lower surface which is flat and horizontally disposed.

28. The gas diffuser as defined in claim 27, wherein the nozzles are straight tubes which pierce the diffusion plate perpendicular to the lower surface thereof.

29. The gas diffuser as defined in claim 21, wherein the nozzles have an identical radius.

30. The gas diffuser as defined in claim 21, wherein the gas is an etching gas.

31. The gas diffuser as defined in claim 21, wherein the gas is a vapor deposition gas.

32. A gas diffuser for fabricating a semiconductor device, comprising:

a hermetic cylinder with a hollow formed therein;

a gas inlet opened upward disposed in an upper side of the hermetic cylinder for a gas to flow into the hollow;

a disk-shaped diffusion plate disposed in a lower side of the hermetic cylinder; and a plurality of nozzles formed in the diffusion plate to direct and control a stream of the gas pouring out of the hollow, wherein a thickness of the diffusion plate increase with radial distance from the center thereof, such that lengths of the nozzles through which the gas passes also increase with radial distance from the center of the diffusion plate, and a velocity distribution of diffused gas at a position directly under the diffusion plate and spaced a radial distance "r" from a position directly under a center of the diffusion plate is $$V(r)=V_0((r/r_0)^2-1),$$

wherein $r_0$ is a radius of the diffusion plate, and $V_0$ is a velocity of gas at the position directly under the center of the diffusion plate, and a concentration distribution of diffused gas at a position directly under the diffusion plate and spaced a radial distance "r" from a position directly under the center of the diffusion plate is $$C(r) = \sum_{k=1}^{N_k} a_k \varphi_k(r),$$

wherein $\omega_k(r)$ is a Chebyshev polynomial, $N_k$ is a number of polynomials, and $a_k$ is a proportional constant, wherein $\omega_k(r)$ represents a Chebyshev polynomial of $2(k-1)$ order because the polynomial used is of an even order in consideration of geometrical form and symmetric points with respect to a boundary position at r=0.

33. The gas diffuser as defined in claim 32, wherein a distance in a radial direction of the diffusion plate between radially adjacent nozzles decreases and then increases as radial distance between the nozzles and the center of the diffusion plate increases, such that density of nozzles is low in the center of the diffusion plate, high at a distance from the center of the diffusion plate, and then low again toward peripheral edges of the diffusion plate.

34. The gas diffuser as defined in claim 32, wherein the diffusion plate has a lower surface which is flat and horizontally disposed.

35. The gas diffuser as defined in claim 32, wherein the gas is an etching gas.

36. The gas diffuser as defined in claim 32, wherein the gas is a vapor deposition gas.

37. A reaction furnace for fabricating a semiconductor device comprising:

a gas diffuser disposed in an upper portion of the reaction furnace for injecting a gas onto a surface of a wafer; and a support plate disposed in a lower portion of the reaction furnace for supporting the wafer, wherein the gas diffuser comprises:

a hermetic cylinder with a hollow formed therein;

a gas inlet opened upward disposed in an upper side of the hermetic cylinder for the gas to flow into the hollow;

a disk-shaped diffusion plate disposed in a lower side of the hermitic cylinder; and a plurality of nozzles formed in the diffusion plate to direct and control a stream of the gas pouring out of the hollow, wherein a thickness of the diffusion plate increases with radial distance from a center thereof, such that lengths of the nozzles through which the gas passes also increase with radial distance from the center of the diffusion plate, and the diffusion plate being disposed in the upper portion of the reaction furnace spaced from the surface of the wafer by a distance equal to half a radius of the wafer.

38. The reaction furnace as defined in claim 37, wherein a distance in a radial direction of the diffusion plate between radially adjacent nozzles decreases and then increases as radial distance between the nozzles and a center of the diffusion plate increases, such that density of nozzles is low in the center of the diffusion plate, high at a distance from the center of the diffusion plate, and then low again toward peripheral edges of the diffusion plate.

39. The reaction furnace as defined in claim 37, wherein a gas exhaust hole is disposed under the wafer in order to discharge the gas downwards with a vacuum pressure.

40. The reaction furnace as defined in claim 37, wherein the diffusion plate has a lower surface which is flat and horizontally disposed in the reaction furnace.

41. The reaction furnace as defined in claim 40, wherein the nozzles are straight tubes which pierce the diffusion plate perpendicular to the lower surface thereof.

42. The gas diffuser as defined in claim 37, wherein the nozzles have an identical radius.

43. The gas diffuser as defined in claim 37, wherein the gas is an etching gas.

44. The gas diffuser as defined in claim 37, wherein the gas is a vapor deposition gas.

45. A reaction furnace for fabricating a semiconductor device comprising:

a gas diffuser disposed in an upper portion of the reaction furnace for injecting a gas onto a surface of a wafer; and a support plate disposed in a lower portion of the reaction furnace for supporting the wafer, wherein the gas diffuser comprises:

a hermetic cylinder with a hollow formed therein;

a gas inlet opened upward disposed in an upper side of the hermetic cylinder for the gas to flow into the hollow;

a disk-shaped diffusion plate disposed in a lower side of the hermetic cylinder; and a plurality of nozzles formed in the diffusion plate to direct and control a stream of the gas pouring out of the hollow, wherein a thickness of the diffusion plate increases with radial distance from a center thereof, such that lengths of the nozzles through which the gas passes also increase with radial distance from the center of the diffusion plate, and the diffusion plate being disposed in the upper portion of the reaction furnace space from the surface of the wafer by a distance equal to a radius of the wafer.

46. The reaction furnace as defined in claim 45, wherein a distance in a radial direction of the diffusion plate between radially adjacent nozzles decreases and then increases as radial distance between the nozzles and a center of the diffusion plate increases, such that density of nozzles is low in the center of the diffusion plate, high at a distance from the center of the diffusion plate, and the low again toward peripheral edges of the diffusion plate.

47. The reaction furnace as defined in claim 45, wherein a gas exhaust hole is disposed under the wafer in order to discharge the gas downwards with a vacuum pressure.

48. The reaction furnace as defined in claim 45, wherein the diffusion plate has a lower surface which is flat and horizontally disposed in the reaction furnace.

49. The reaction furnace as defined in claim 48, wherein the nozzles are straight tubes which pierce the diffusion plate perpendicular to the lower surface thereof.

50. The gas diffuser as defined in claim 45, wherein the nozzles have an identical radius.

51. The gas diffuser as defined in claim 45, wherein the gas is an etching gas.

52. The gas diffuser as defined in claim 45, wherein the gas is a vapor deposition gas.

* * * * *